(12) United States Patent
Yu et al.

(10) Patent No.: US 11,635,679 B1
(45) Date of Patent: *Apr. 25, 2023

(54) ALTERNATING PHASE SHIFT MASK

(71) Applicant: Seagate Technology LLC, Fremont, CA (US)

(72) Inventors: Dan Yu, Shakopee, MN (US); Aaron Michael Bowser, St. Paul, MN (US)

(73) Assignee: SEAGATE TECHNOLOGY LLC, Fremont, CA (US)

( * ) Notice: Subject to any disclaimer, the term of this patent is extended or adjusted under 35 U.S.C. 154(b) by 288 days.

This patent is subject to a terminal disclaimer.

(21) Appl. No.: 17/032,358

(22) Filed: Sep. 25, 2020

Related U.S. Application Data

(63) Continuation of application No. 15/843,451, filed on Dec. 15, 2017, now Pat. No. 10,859,903.

(51) Int. Cl.
*G03F 1/30* (2012.01)

(52) U.S. Cl.
CPC .................... *G03F 1/30* (2013.01)

(58) Field of Classification Search
CPC ............... G03F 1/26; G03F 1/32; G03F 1/30
See application file for complete search history.

(56) References Cited

U.S. PATENT DOCUMENTS

| | | |
|---|---|---|
| 6,458,495 B1 | 10/2002 | Tsai et al. |
| 6,523,165 B2 | 2/2003 | Liu et al. |
| 7,387,867 B2 | 6/2008 | Hasegawa et al. |
| 9,341,939 B1 | 5/2016 | Yu et al. |
| 9,482,965 B2 | 11/2016 | Yu et al. |
| 10,859,903 B1 * | 12/2020 | Yu .............................. G03F 1/30 |
| 2004/0063000 A1 | 4/2004 | Maurer et al. |
| 2004/0126674 A1 | 7/2004 | Taniguchi et al. |
| 2005/0123837 A1 | 6/2005 | Chen |

OTHER PUBLICATIONS

Hotta, et al., "New Double Exposure Technique Using Alternating Phase-Shifting Mask with Reversed Phase," Proc. SPIE 5377, Optical Microlithography XVII, May 28, 2004, 11 Pages, Tokyo, Japan.

* cited by examiner

*Primary Examiner* — Daborah Chacko-Davis
(74) *Attorney, Agent, or Firm* — Holzer Patel Drennan

(57) ABSTRACT

An alternating phase-shifting mask (Alt-PSM) comprising a 0° phase portion having a first width and a 180° phase portion having a second width greater than the first width. Example differences between the width of the 180° phase portion and the 0° phase portion may be 10 nm, 15 nm, or 20 nm. An Alt-PSM having phase portions of different widths can have an aerial image intensity transmission graph that is symmetric, for example, at 0.2-0.3 intensity.

20 Claims, 4 Drawing Sheets

ALTERNATING PHASE SHIFT MASK

CROSS-REFERENCE

This application is a continuation application of U.S. Ser. No. 15/843,451 filed Dec. 15, 2017, now U.S. Pat. No. 10,859,903, which is incorporated herein by reference for all purposes.

BACKGROUND

Photolithography is a process used in fabrication of nanoscale components (e.g., electrical circuits, optical components) that are generally made of thin films layered on a substrate, e.g., a wafer. One process involves depositing thin film layer(s) on a substrate, forming a geometric pattern via a layer of photoresist material, and then selectively removing parts of the thin film or the substrate itself based on the geometric pattern.

During the photolithography process, electromagnetic energy (e.g., light) is transmitted through a photomask or reticle to expose parts of the photoresist layer in the desired pattern. The exposed photoresist can be subjected to a chemical treatment (e.g., "developing") that removes areas of photoresist that were exposed to the light. In other cases, areas receiving no light exposure may instead be removed by a developer. In either case, the resulting surface has a pattern formed by the developed photoresist, and the surface can then be further treated. For example, etching may be performed so that exposed areas of the surface are etched away, while those areas covered by the photoresist are unaffected.

Photolithography is commonly associated with the manufacture of an integrated electronic circuit. Photolithography can also be used in making integrated optics, which includes optical components (e.g., lasers, waveguides, lenses, mirrors, collimators, etc.) that are formed on a substrate in a manner analogous to integrated electrical circuits. Photolithography is also used in manufacturing recording head components for data storage devices.

SUMMARY

This disclosure is directed to lithographic processes and alternating phase shifting or alternating phase shift masks (Alt-PSMs) used in those processes. The Alt-PSMs have a physical structure that balances the light transmission intensity through the 0° portion and the 180° portion of the Alt-PSM.

One particular implementation described herein is an alternating phase-shifting mask (Alt-PSM) comprising a 0° phase portion having a first width and a 180° phase portion having a second width greater than the first width.

Another particular implementation described herein is an alternating phase-shifting mask (Alt-PSM) that provides an aerial image intensity graph symmetrical at 0.2-0.3 intensity.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. These and various other features and advantages will be apparent from a reading of the following Detailed Description.

BRIEF DESCRIPTIONS OF THE DRAWINGS

FIG. 1A is a schematic side view of an example mask geometry of an Alt-PSM mask; FIG. 1B is an aerial image intensity graph from the Alt-PSM of FIG. 1A.

FIG. 2A is a schematic side view of an example mask geometry of an Alt-PSM mask according to the present disclosure; FIG. 2B is a schematic top view of the Alt-PSM of FIG. 2A; FIG. 2C is an aerial image intensity graph from the Alt-PSM of FIGS. 2A and 2B.

DETAILED DESCRIPTION

Figure 1A:
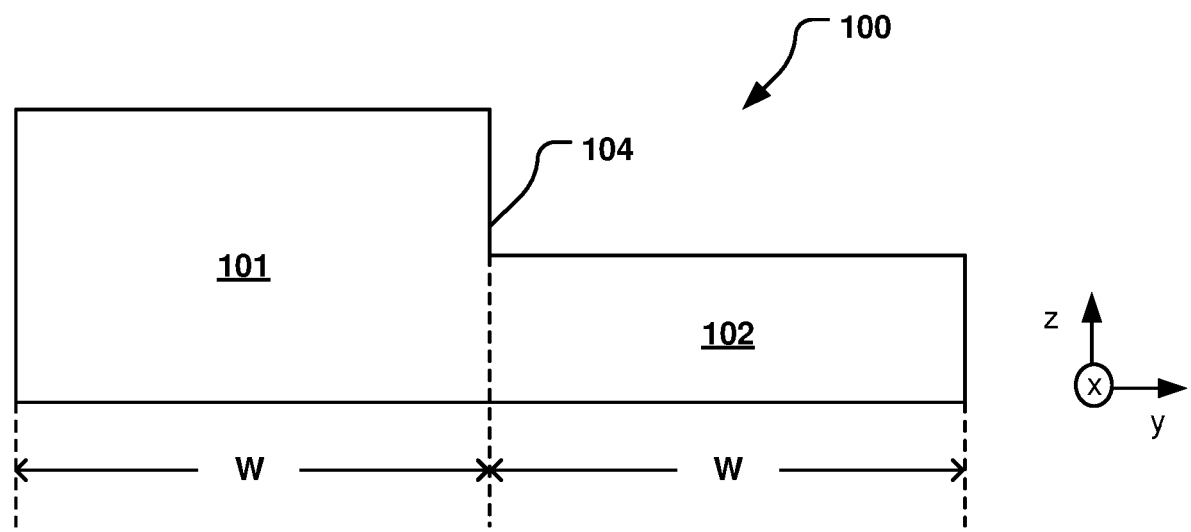

An ongoing desire to have more densely packed integrated devices has resulted in changes to the photolithography process in order to form smaller individual feature sizes. The minimum feature size or "critical dimension" (CD) obtainable by a process is determined approximately by the formula $CD=k_1 * \lambda / NA$, where $k_1$ is a process-specific coefficient, $\lambda$ is the wavelength of applied light/energy, and NA is the numerical aperture of the optical lens as seen from the substrate or wafer.

For fabrication of dense features with a given value of $k_1$, the ability to project a usable image of a small feature onto a wafer is limited by the wavelength $\lambda$ and the ability of the projection optics to capture enough diffraction orders from an illuminated mask. When either dense features or isolated features are made from a photomask or a reticle of a certain size and/or shape, the transitions between light and dark at the edges of the projected image may not be sufficiently sharply defined to correctly form target photoresist patterns. This may result, among other things, in reducing the contrast of aerial images and also the quality of resulting photoresist profiles. As a result, features 150 nm or below in size may need to utilize phase shifting techniques to enhance the image quality at the wafer, e.g., sharpening edges of features to improve resist profiles.

Phase-shifting generally involves selectively changing phase of part of the energy passing through a photomask/reticle so that the phase-shifted energy is additive or subtractive with unshifted energy at the surface of the wafer. By carefully controlling the shape, location, and phase shift angle of mask features, the resulting photoresist patterns can have more precisely defined edges.

Phase shifts may be obtained in a number of ways. For example, one process known as attenuated phase shifting utilizes a layer of non-opaque material that causes light passing through the material to change in phase compared to light passing through transparent parts of the mask.

Another technique is known as alternating phase shift, where the transparent mask material (e.g., quartz or $SiO_2$) is sized (e.g., etched) to have different thicknesses. The thicknesses are selected to cause a desired relative phase difference in light passing through the different thicknesses. The resulting mask is referred to as an "alternating phase shift mask" or "alternating phase shifting mask," both of which are referred to herein as "Alt-PSM". The portion of the Alt-PSM being thicker is referred to as the 0° phase portion, while the portion of the Alt-PSM being less thick is referred to as the 180° phase portion, as the thickness difference allows the light to travel half of the wavelength in the transparent material, generating a phase difference of 180° between the 0° and 180° portions.

An Alt-PSM can be used for patterning extremely narrow features; however, the intrinsic phase termination issues make some designs difficult, even with an Alt-PSM. To address this, in one implementation, a combination of an Alt-PSM and a chrome-on-glass trim mask (referred to as a "trim mask") may be used. In another implementation, a second Alt-PSM with reversed phase may be exposed after a first exposure, thus utilizing a double exposure technique.

As the feature size reduces, the imbalance of transmission intensity between the 0° and 180° phase portions results in significant CD variation and placement errors for the photoresist pattern.

The technology disclosed herein involves an Alt-PSM and photolithography method using that Alt-PSM to reduce and essentially eliminate the transmission intensity issue by providing an Alt-PSM that has dimensions that compensate for the asymmetric intensity, resulting in symmetrical transmission on the left and right resist edges.

FIG. 1A shows a conventional Alt-PSM 100 in a side view. The Alt-PSM 100 has a first portion 101 that is a 0° phase portion and a second portion 102 that is a 180° phase portion, both which provide 100% light transmission. The numeral 104 identifies the phase transition edge from the 0° phase portion 101 to the 180° phase portion 102. The 180° phase portion 102 is where the material forming the Alt-PSM 100 (e.g., quartz or $SiO_2$) has been etched away leaving a thinner area than in the 0° phase portion 101 where material has not been etched away. An example for the Alt-PSM 100 has both the 0° phase portion 101 and the 180° phase portion 102 having a width "W" in the y-direction of approximately 2 micrometers (μm). Similarly, the Alt-PSM 100 has the depth (in the x-direction) for both the 0° phase portion 101 and the 180° phase portion 102 being the same, in the range of submicron to tens of microns.

The optical path for the 180° phase portion 102 is different than the 0° phase portion 101, due to the difference in thickness. The effect of the difference in the optical path results in a phase shift. The image transferred onto a wafer can have high intensity in most areas, while at the phase transition edge 104, where the phase shift occurs from the 0° phase portion 101 to the 180° phase portion 102, the light intensity drops.

Figure 1B:
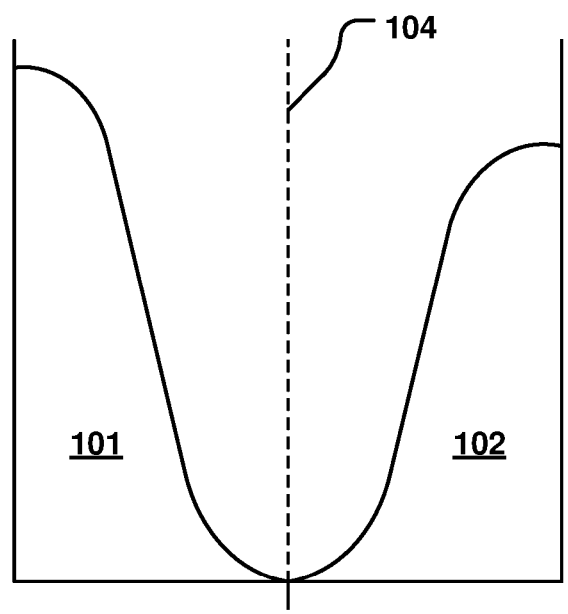

FIG. 1B is an aerial image intensity graph, illustrating the light transmission intensity through the Alt-PSM 100. As seen, there is little or essentially no light transmission at the phase transmission edge 104. Generally, it is at this location that the resulting device is formed. The light intensity curve for the 0° phase portion 101 is different from that for the 180° phase portion 102 due to the difference in thickness of the mask material (e.g., quartz, $SiO_2$) at the two phase portions 101, 102. As explained above, to compensate for this asymmetry, a double exposure technique is used, either with a second, trim mask or by reversing the Alt-PSM for a second exposure.

Figure 2A:
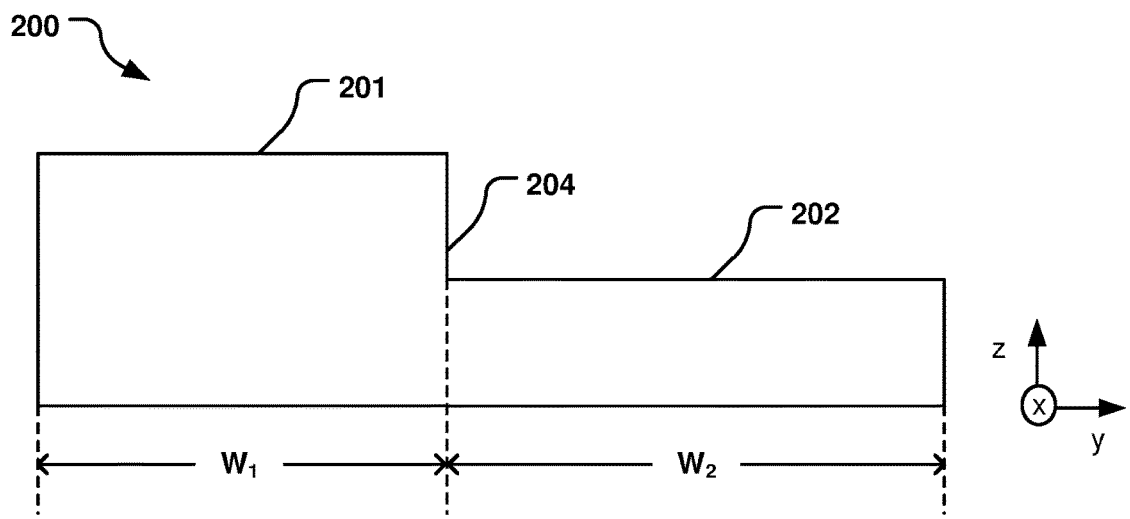
Figure 2B:
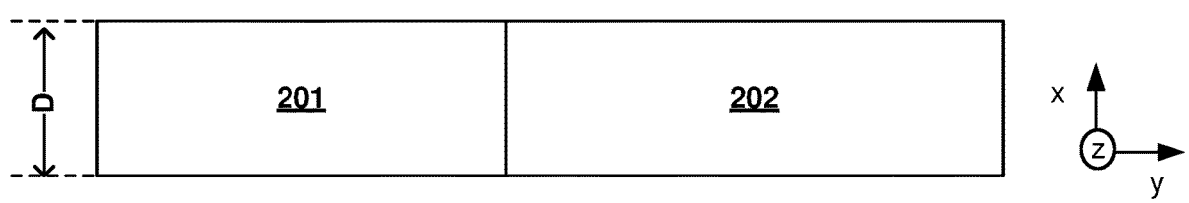

To avoid the need for a second exposure in order to balance light intensity, the physical configuration of the Alt-PSM is modified from that conventionally known. FIGS. 2A and 2B show an Alt-PSM 200 according to the present disclosure, with FIG. 2A being a side view and FIG. 2B being a top down view. Similar to the conventional Alt-PSM 100, the Alt-PSM 200 has a first portion 201 that is a 0° phase portion and a second portion 202 that is a 180° phase portion, both which provide light transmission therethrough. The numeral 204 identifies the phase transition edge from the 0° phase portion 201 to the 180° phase portion 202. The 0° phase portion 201 has a width $w_1$ in the y-direction and the 180° phase portion 202 has a width $w_2$. Unlike a conventional Alt-PSM, $w_1$ and $w_2$ are not equal; that is, $w_2$ is greater than $w_1$. Additionally, unlike a conventional Alt-PSM, $w_1$ and $w_2$ are submicron or close to submicron; that is, $w_1$ and $w_2$ are no greater than 1 micrometer in some implementations.

Having the widths of the two portions different, specifically, having $w_2$ greater than $w_1$, adjusts the aerial image intensity curve in a manner so that the resulting light intensity curve for the 0° phase portion 201 is the same as the light intensity curve for the 180° phase portion 202.

The width $w_2$ of 180° phase portion 202, in some implementations, is at least 10 nm greater than the width $w_1$ of 0° phase portion 201, in some implementations at least 15 nm greater, in other implementations at least 20 nm greater, and in some implementations as much as 30 nm greater.

In other implementations, the width $w_2$ of 180° phase portion 202 is at least 2% greater than the width $w_1$ of 0° phase portion 201, in some implementations at least 2.5% greater and in other implementations at least 3% greater.

In other implementations, the ratio of the width $w_2$ of 180° phase portion 202 to the width $w_1$ of 0° phase portion 201, is at least 1.02, and in other implementations at least 1.03 or at least 1.04.

An example Alt-PSM 200 has a width $w_1$ of 0° phase portion 201 of 595 nm and a width $w_2$ of 180° phase portion 202 of 610 nm. In this example, $w_2$ is 15 nm greater than $w_1$, $w_2$ is 2.5% greater than $w_1$, and the ratio of $w_2$:$w_1$ is 1.025.

Another example Alt-PSM 200 has a width $w_1$ of 0° phase portion 201 of 745 nm and a width $w_2$ of 180° phase portion 202 of 765 nm. In this example, $w_2$ is 20 nm greater than $w_1$, $w_2$ is 2.65% greater than $w_1$, and the ratio of $w_2$:$w_1$ is 1.027.

Both the 0° phase portion 201 and the 180° phase portion 202 have a depth D in the x-direction. This depth D can be in the range of submicron to tens of microns.

Figure 2C:
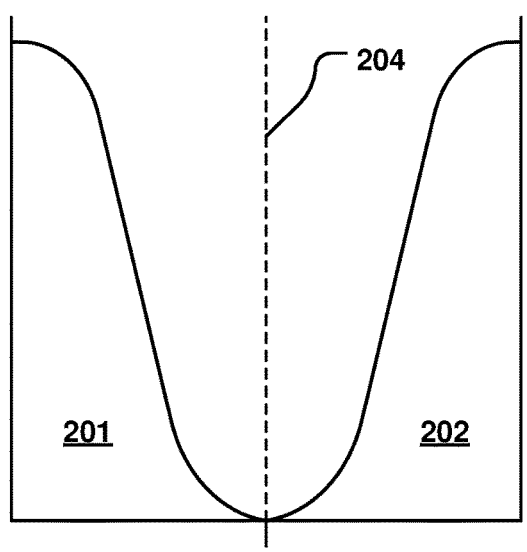

FIG. 2C is an aerial image intensity graph for the light transmission intensity through the Alt-PSM 200 having different width phase portions 201, 202. There is little or essentially no light transmission at the phase transmission edge 204. Having the width $w_2$ for the 180° phase portion 202 greater than the width $w_1$ for the 0° phase portion 201 the correct amount, a symmetrical light intensity curve can be obtained. By having a symmetrical light intensity curve, use of double exposure techniques for the purpose of balancing the light can be eliminated.

In some implementations, a trim mask may nevertheless be used with the Alt-PSM of the present disclosure to further define the edges. Trim masks and their use are known; for example, U.S. Pat. No. 9,341,939 to Yu et al. describes trim masks and uses thereof. In general, the trim mask is used with the Alt-PSM, with either the trim mask centered with the Alt-PSM or with an offset overlap of the trim mask in relation to the Alt-PSM.

The Alt-PSM and the trim mask are exposed by placing the Alt-PSM and the trim mask between the light source and a wafer where a photoresist pattern is desired. In order to pattern small features, an Alt-PSM can be exposed, and subsequently a trim mask is exposed to finalize a target area and remove unwanted large features.

Figure 3:
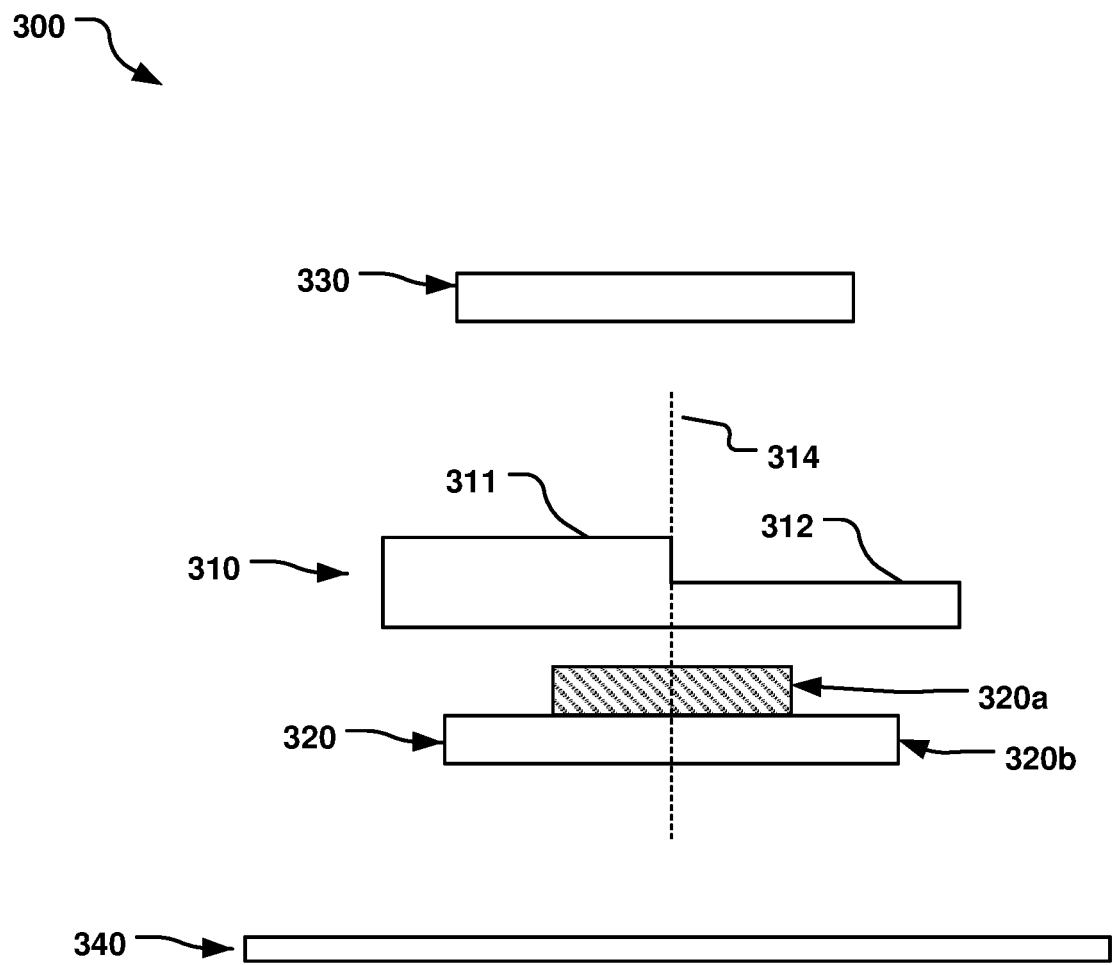
FIG. 3 is a schematic side view of features of an example photolithograph process utilizing an Alt-PSM and a trim mask.
Figure 3:
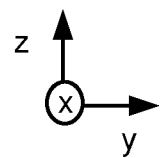

FIG. 3 illustrates an assembly 300 for a photolithography process, the assembly including an Alt-PSM 310 having portions of different width, such as Alt-PSM 200 of FIGS. 2A and 2B, and a trim mask 320, both which are positioned between a light source 330 and a substrate (e.g., wafer) 340. The Alt-PSM 310 has a 0° phase portion 311, a 180° phase portion 312, and a phase transition edge 314. The trim mask 320 may be formed from two different materials, e.g., chromium (Cr) and quartz or glass, a non-light transmissive material 320a (e.g., opaque) and a light transmissive material 320b. The center of the trim mask 320, in some implementations particularly, the non-light transmissive material 320a, is aligned with the phase transition edge 314 of the Alt-PSM 310 along the y-axis.

Figure 4:
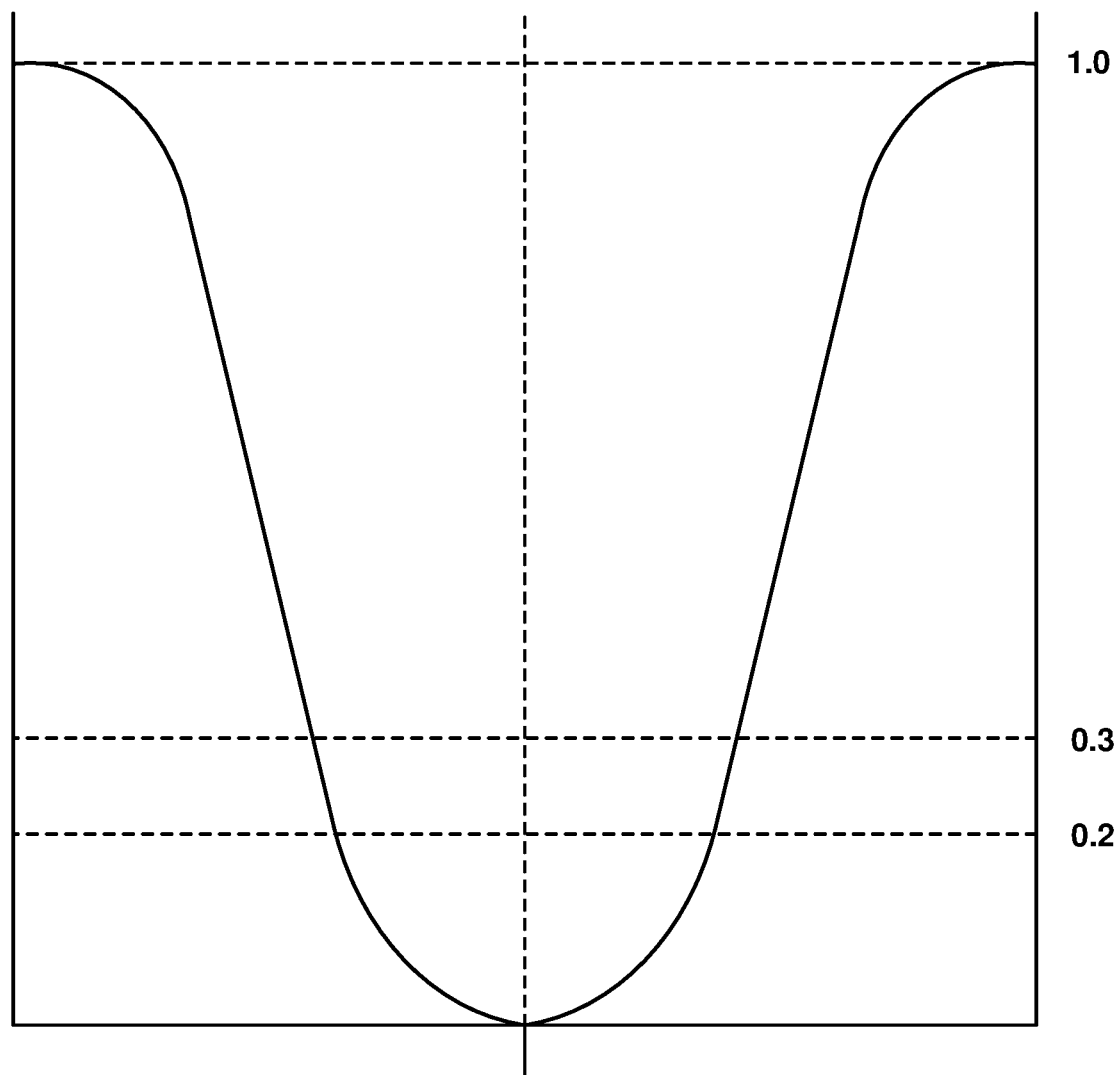
FIG. 4 is an aerial image intensity graph from an example Alt-PSM mask.

FIG. 4 is an aerial image intensity graph for the light transmission intensity through an Alt-PSM according to this disclosure having different width phase portions. The light intensity curve is essentially symmetrical for the two phase portions, the 0° phase portion and the 180° phase portion; that is, the light intensity curve is essentially symmetrical about the phase shift edge defining the two phase portions. In some implementations, the light intensity curve is symmetrical within the area of 0.2 to 0.3 light transmission (when the highest point of the curve is normalized to 1.0 light transmission). In some implementations, the light transmission curve is symmetrical for the entire range of 0.2 to 0.3. In yet other implementations, the light transmission curves for both phase portions are essentially the same.

The above specification and examples provide a complete description of the structure and use of exemplary implementations of the invention. The above description provides specific implementations. It is to be understood that other implementations are contemplated and may be made without departing from the scope or spirit of the present disclosure. The above detailed description, therefore, is not to be taken in a limiting sense. While the present disclosure is not so limited, an appreciation of various aspects of the disclosure will be gained through a discussion of the examples provided.

Unless otherwise indicated, all numbers expressing feature sizes, amounts, and physical properties are to be understood as being modified by the term "about," whether or not the term "about" is immediately present. Accordingly, unless indicated to the contrary, the numerical parameters set forth are approximations that can vary depending upon the desired properties sought to be obtained by those skilled in the art utilizing the teachings disclosed herein.

As used herein, the singular forms "a", "an", and "the" encompass implementations having plural referents, unless the content clearly dictates otherwise. As used in this specification and the appended claims, the term "or" is generally employed in its sense including "and/or" unless the content clearly dictates otherwise.

Since many implementations of the invention can be made without departing from the spirit and scope of the invention, the invention resides in the claims hereinafter appended. Furthermore, structural features of the different implementations may be combined in yet another implementation without departing from the recited claims.

What is claimed is:

1. A method of forming an individual feature on a wafer using a photolithography process, the method comprising:
    providing an alternating phase-shifting mask (Alt-PSM) comprising a 0° phase portion having a first width and a 180° phase portion having a second width less than 1 micrometer and greater than the first width, the 0° phase portion adjacent to the 180° phase portion at a phase transition edge,
    forming the individual feature on the wafer using the Alt-PSM via the photolithography process, the feature formed on the wafer at a location aligned with the phase transition edge of the Alt-PSM, the feature having a dimension less than 150 nm.

2. The method of claim 1, wherein the second width is at least 20 nm greater than the first width.

3. The method of claim 1, wherein the second width is at least 30 nm greater than the first width.

4. The method of claim 1, wherein the second width is at least 2% greater than the first width.

5. The method of claim 1, wherein the second width is less than 765 nm.

6. The method of claim 5, wherein the first width is less than 745 nm.

7. The method of claim 1, wherein a ratio of the second width to the first width is at least 1.03.

8. A method of forming an individual feature on a wafer, the method comprising:
    providing an alternating phase-shifting mask (Alt-PSM) comprising a 0° phase portion having a first width and a 180° phase portion having a second width less than 1 micrometer and greater than the first width, the 0° phase portion adjacent to the 180° phase portion at a phase transition edge,
    transmitting light through the Alt-PSM onto the wafer to form the individual feature on the wafer at a location corresponding to the phase transition edge, the feature having a dimension less than 150 nm.

9. The method of claim 8, wherein the second width is at least 20 nm greater than the first width.

10. The method of claim 8, wherein the second width is at least 2% greater than the first width.

11. The method of claim 8, wherein a ratio of the second width to the first width is at least 1.025.

12. The method of claim 8, wherein the second width is less than 765 nm.

13. The method of claim 12, wherein the first width is less than 745 nm.

14. The method of claim 8, further comprising transmitting the light through a trim mask positioned between the Alt-PSM and the substrate.

15. A method of creating an aerial image intensity graph, the method comprising:
    providing an alternating phase-shifting mask (Alt-PSM) comprising a 0° phase portion having a first width and a 180° phase portion having a second width less than 1 micrometer and greater than the first width, the 0° phase portion adjacent to the 180° phase portion at a phase transition edge; and
    creating the aerial image intensity graph by transmitting light through the Alt-PSM and recording an intensity of the transmitted light, the graph showing no transmission intensity through the Alt-PSM at the phase transition edge and symmetrical transmission intensity at 0.2-0.3 intensity through the 0° phase portion and the 180° phase portion.

16. The method of claim 15, wherein the aerial intensity graph is symmetrical within the entire range of 0.2-0.3 intensity.

17. The method of claim 15, wherein the aerial intensity graph is symmetrical at at least one value within 0.2-0.3 intensity.

18. The method of claim 15, wherein the second width is at least 20 nm greater than the first width.

19. The method of claim 15, wherein the second width is at least 2% greater than the first width.

20. The method of claim 15, wherein the second width is less than 765 nm.

* * * * *